(12) United States Patent
Takeuchi

(10) Patent No.: US 7,879,512 B2
(45) Date of Patent: Feb. 1, 2011

(54) PHOTOMASK, MANUFACTURING METHOD THEREOF, AND ELECTRONIC DEVICE MANUFACTURING METHOD

(75) Inventor: Kanji Takeuchi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 130 days.

(21) Appl. No.: 12/018,495

(22) Filed: Jan. 23, 2008

(65) Prior Publication Data

US 2008/0118850 A1 May 22, 2008

Related U.S. Application Data

(63) Continuation of application No. PCT/JP2005/013877, filed on Jul. 28, 2005.

(51) Int. Cl.
*G03F 1/00* (2006.01)
*H01L 21/00* (2006.01)
(52) U.S. Cl. .......................................... 430/5; 430/311
(58) Field of Classification Search ...................... 430/5; 716/19, 20, 21
See application file for complete search history.

(56) References Cited

U.S. PATENT DOCUMENTS 6,465,138 B1 * 10/2002 Stanton ........................ 430/5
6,601,231 B2 7/2003 LaCour
2003/0014731 A1 1/2003 LaCour
2003/0208742 A1 * 11/2003 LaCour ....................... 716/21
2004/0265708 A1 12/2004 Misaka

FOREIGN PATENT DOCUMENTS

| JP | 08062823 A | 3/1996 |
| JP | 2000206671 A | 7/2000 |
| JP | 2005017433 A | 1/2005 |

OTHER PUBLICATIONS

International Search Report of PCT/JP2005/013877, date of mailing Nov. 1, 2005.

* cited by examiner

*Primary Examiner*—Mark F Huff
*Assistant Examiner*—Jonathan Jelsma
(74) *Attorney, Agent, or Firm*—Fujitsu Patent Center

(57) ABSTRACT

A photomask includes a transparent substrate and an opaque film formed on the transparent substrate. The opaque film is configured to form a device pattern with which a wafer is to be exposed; and at least one pair of assist patterns is formed by the opaque film, one assist pattern on each side of the device pattern on the transparent substrate. The size of each assist pattern of the pair of assist patterns is such that the assist pattern is not resolved on the wafer. A part of each assist pattern of the pair of assist patterns includes step portions.

10 Claims, 18 Drawing Sheets

F1

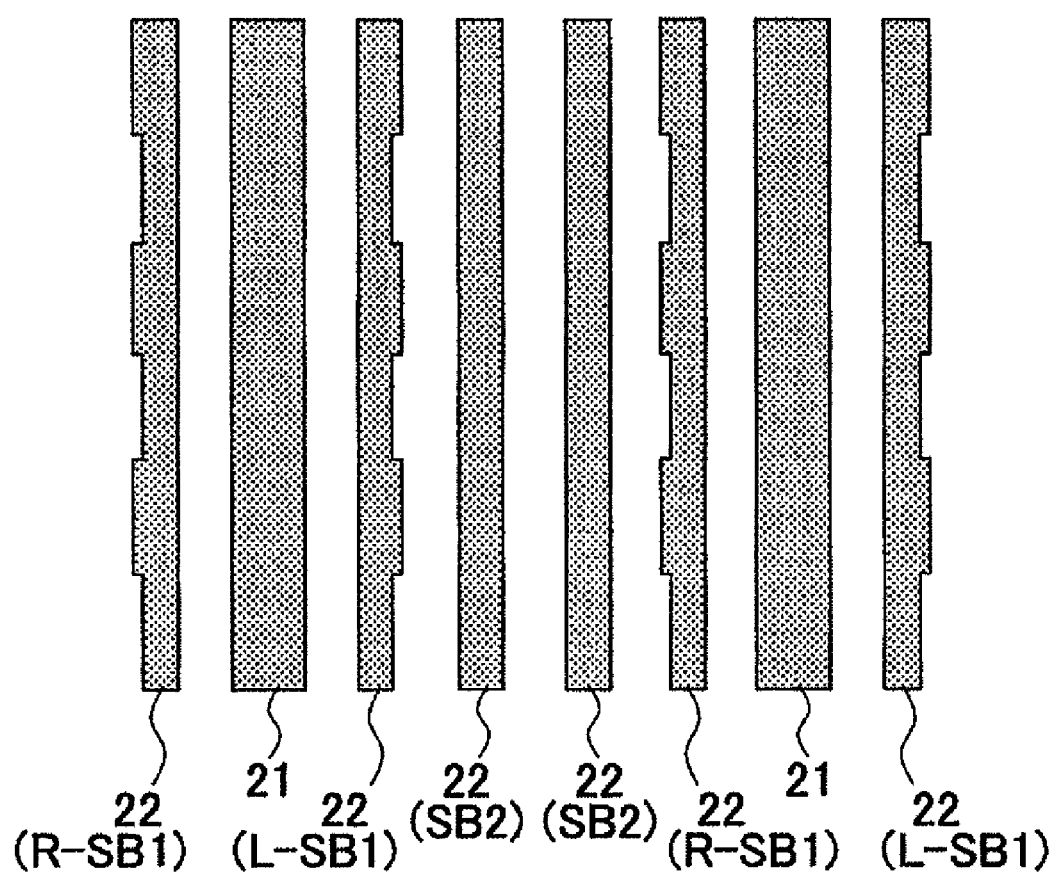

PHOTOMASK, MANUFACTURING METHOD THEREOF, AND ELECTRONIC DEVICE MANUFACTURING METHOD

CROSS-REFERENCE TO RELATED APPLICATION

This application is a U.S. continuation application filed under 35 USC 111(a) claiming benefit under 35 USC 120 and 365(c) of PCT application JP2005/013877, filed Jul. 28, 2005. The foregoing application is hereby incorporated herein by reference.

BACKGROUND OF THE INVENTION

1. Field of the Invention

The present invention generally relates to photomasks, and more particularly to a photomask used for forming microscopic patterns in manufacturing an electronic device such as a semiconductor device or a magnetic element. Furthermore, the present invention relates to a method of manufacturing an electronic device with the use of such a photomask.

2. Description of the Related Art

In recent years, requirements have been identified for forming extremely microscopic device patterns in manufacturing ultra-microscopic semiconductor integrated circuit devices and magnetic elements such as magnetic heads. Various technologies have been proposed for forming microscopic elements.

In order to form microscopic device patterns on a wafer by exposing the wafer to light, it is necessary to use short-wavelength light and an optical system with a high numerical aperture. However, an optical system with a high numerical aperture has a shallow focal depth. Therefore, if such an optical system is used for exposing a wafer to light to form a desired microscopic pattern on the wafer, it will be necessary to maintain precise focusing across the entire wafer surface. However, the wafer surface will inevitably have some undulations, and therefore it is difficult to maintain precise focusing across the entire wafer surface. This problem is particularly significant when exposing the wafer to form an isolated pattern.

In order to solve this problem, the following super-resolution technology is known. That is, so-called assist patterns are added onto a photomask carrying a desired device pattern, on either side of the device pattern. The assist patterns are not resolved on the wafer. By adding such assist patterns, the focus range can be expanded. This super-resolution technology makes it possible to expand the focus range, so that adverse effects of undulations on the wafer can be attenuated.

Patent Document 1: Japanese Laid-Open Patent Application No. 2000-206671

FIGS. 1A and 1B illustrate a positive type photomask 10A and a negative type photomask 10B, respectively, having assist patterns formed thereon.

Referring to FIG. 1A, on the photomask 11A, a primary pattern 11A corresponding to an exposing pattern to be formed on the wafer by exposure is formed as a light shielding pattern. A pair of assist patterns 12A is formed, one assist pattern 12A on either side of the primary pattern 11A, which assist patterns 12A are spaced apart from the primary pattern 11A. The width of each assist pattern 12A is such that the assist pattern 12A will not be resolved on the wafer. The assist patterns 12A are also formed as light shielding patterns.

On the negative type photomask 10B shown in FIG. 1B, a primary pattern 11B corresponding to an exposing pattern to be formed on the wafer by exposure is formed as a slit in an opaque film. A different pair of assist patterns 12B is formed, one assist pattern 12B on either side of the primary pattern 11B. The width of each assist pattern 12B is such that the assist pattern 12B will not be resolved on the wafer.

FIGS. 2A and 2B illustrate examples of photomasks having two assist patterns on either side of the primary pattern. FIG. 2A illustrates a positive type photomask 10C and FIG. 2B illustrates a negative type photomask 10D.

Referring to FIG. 2A, the photomask 10C has the primary pattern 11A that is a light shielding pattern. The pair of assist patterns 12A that are light shielding patterns are formed, one assist pattern 12A on either side of the primary pattern 11A. The width of each assist pattern 12A is such that the assist pattern 12A will not be resolved on the wafer. Furthermore, another pair of assist patterns 13A is formed outside of the assist patterns 12A. The width of each assist pattern 13A is such that the assist pattern 13A will not be resolved on the wafer.

The photomask 10D shown in FIG. 2B has the primary pattern 11B that is a slit pattern formed in an opaque film. The pair of assist patterns 12B that are slit patterns formed in the opaque film are formed, one assist pattern 12B on either side of the primary pattern 11B. The width of each assist pattern 12B is such that the assist pattern 12B will not be resolved on the wafer. Furthermore, another pair of assist patterns 13B is formed outside of the assist patterns 12B. The width of each assist pattern 13B is such that the assist pattern 13B will not be resolved on the wafer.

FIG. 3 is a flowchart of a procedure of adding such assist patterns to a primary pattern.

Referring to FIG. 3, in step S1, original pattern data of a photomask pattern is provided. In step S2, the lengths between patterns are measured from the pattern data.

In step S3, reference is made to insertion rules for inserting assist patterns, such as those described in Table 1. In step S4, assist patterns are inserted according to the insertion rules.

TABLE 1

| Pattern intervals D (nm) | No. of assist patterns | Location for arranging assist patterns |
| --- | --- | --- |
| 660 ≦ D | 4 | First pair - 100 nm away from primary (device) pattern Second pair - 100 nm away from first pair |
| 520 ≦ D < 660 | 3 | One pair - 100 nm away from primary (device) pattern At center between assist patterns |
| 380 ≦ D < 520 | 2 | 100 nm away from primary (device) pattern |
| 240 ≦ D < 380 | 1 | At center between primary (device) patterns |
| D < 240 | 0 | — |

In step S5, the lengths between the patterns are measured once again. In step S6, a photomask pattern including assist patterns are output as an original pattern.

Referring to Table 1, if intervals between patterns on a wafer are greater than or equal to 660 nm, a total of four assist patterns will be inserted for each pattern. Specifically, a first pair of assist patterns will be inserted at locations 100 nm away from the primary pattern, and a second pair of assist patterns will be inserted at locations 100 nm away from the first pair of assist patterns. If intervals between patterns on a wafer are greater than or equal to 520 nm and less than 660 nm, a total of three assist patterns will be inserted for each pattern. A pair of assist patterns will be inserted at locations 100 nm away from the primary pattern, and a single assist pattern will be inserted at the center between two assist patterns. If intervals between patterns on a wafer are greater than or equal to 380 nm and less than 520 nm, a total of two assist patterns will be inserted at locations 100 nm away from the primary pattern on the wafer for each pattern. If intervals between patterns on a wafer are greater than or equal to 240 nm and less than 380 nm, one assist pattern will be inserted at the center between primary patterns. If intervals between patterns on a wafer are less than 240 nm, no assist patterns will be inserted. In Table 1, each numeral represents a length on a wafer in units of nm.

FIG. 4 illustrates relationships between focus positions and critical dimensions (CD) of patterns formed on a wafer by exposure. FIG. 4 illustrates three cases. In the first case, as shown in FIG. 5A, only a primary pattern 11A having an exposed width of 100 nm is provided on a wafer (which width is 400 nm on a mask), and no assist patterns are provided. In the second case, as shown in FIG. 5B, on either side of the primary pattern 11A shown in FIG. 5A, there is provided a pair of assist patterns 12A each having an exposed width of 40 nm on a wafer (which width is 160 nm on a mask) and at a location 100 nm away from the primary pattern 11A (400 nm away on a mask). In the third case, as shown in FIG. 5C, on either side of the assist patterns 12A shown in FIG. 5B, there is further provided one of a pair of assist patterns 13A, each assist pattern 13A having an exposed width of 40 nm on a wafer (which width is 160 nm on a mask) and at a location 100 nm away from the inner assist patterns 12A (400 nm away on a mask). In FIG. 4, the zero position of the horizontal axis corresponds to a just focus position. The relationships shown in FIG. 4 are obtained in a simulation according to conditions shown in Table 2.

TABLE 2

| Wavelength | 193 nm |
|---|---|
| Numerical aperture (NA) | 0.85 |
| σ | Outside = 0.85 |
|  | Inside = 0.425 |
| Focus step | 0.01 μm |
| CD target | 100 nm |

Referring to FIG. 4, in a case where the tolerance of the critical dimension is 10% of the target line width (i.e., 90 nm), and the focusing is shifted from the just focus position by about 0.09 μm, the critical dimension will exceed the tolerance if no assist patterns are provided; however, if a pair of assist patterns are provided, the critical dimension will not exceed the tolerance even when the focusing is shifted by about 0.14 μm; furthermore, if two pairs of assist patterns are provided, the focusing range will be greater than or equal to 0.20 μm.

As described above, the assist pattern technology is indispensable in manufacturing today's ultra-microscopic semiconductor devices having a gate length of less than 0.1 μm. However, there has been a critical problem in conventional mask inspection processes.

FIGS. 6A and 6B illustrate a conventional mask inspection process.

As shown in FIGS. 6A and 6B, this mask inspection process is applicable to a case where the chips A of the same type are arranged adjacent to each other on a photomask. A photomask 203, which corresponds to any of the photomasks described above, is placed on an X-Y stage 202 of an inspection device. Under the control of a control device 211, a horizontal alignment 209 and an illumination optical system 201 are adjusted. Subsequently, the inspection starts.

When the inspection starts, as shown in FIG. 6B, the X-Y stage 202 is moved by the control device 211 via a driving unit 210 in such a manner that the inspection area is scanned from one end to the other end. Light that has passed through the photomask is condensed onto a light receiving element 205 by an objective lens 204, and corresponding image data are saved in an image memory 206.

When a scanning operation of one chip ends, the scanning operation for the next chip starts. At this stage, in a defect detection circuit 207, image data acquired by the light receiving element 205 are compared with image data at a corresponding portion of a previous chip saved in the image memory 206. When a difference is detected, the corresponding coordinates are saved as a defect in a defect information memory 208.

When such a scanning operation ends, the contents in the image memory 206 are cleared, and the next scanning operation starts.

When such a scanning operation ends, patterns near the coordinates that have been saved are displayed on a defect confirmation screen. The operator confirms, by visual inspection, whether the detected defect is actually a defect, and determines whether a correction is to be made.

A similar inspection can be performed by using design data as the standard data, instead of using image data of a previous chip.

FIGS. 7A and 7B illustrate photomasks including such defects. FIG. 7A illustrates a case where there is a defect 11X in the primary pattern 11A, while FIG. 7B illustrates a case where there is a defect 12X in the assist pattern 12A. Although not illustrated, similar defects may occur in a photomask having two or more pairs of assist patterns or in a negative type photomask.

As described above, in order to inspect such photomasks, the operator (a human being) needs to confirm the defect by visual inspection at the final stage. Considering that a photomask carries many patterns, the workload of the operator for making such inspections is high, and therefore, it is necessary to reduce this workload.

SUMMARY OF THE INVENTION

According to one aspect of an embodiment, there is a photomask including a transparent substrate; an opaque film formed on the transparent substrate, wherein the opaque film is configured to form a device pattern on a wafer as the wafer is exposed to light; and at least one pair of assist patterns formed by the opaque film in such a manner as to be adjacent to the device pattern on the transparent substrate, wherein a size of each assist pattern of the pair of assist patterns is such that the assist pattern will not be resolved on the wafer, wherein a part of each assist pattern of the pair of assist patterns includes step portions.

According to another aspect of an embodiment, there is a method of manufacturing an electronic device, the method including the step of exposing a substrate to light in such a manner that a device pattern is formed on the substrate, wherein the step of forming the device pattern by exposing the substrate to the light is performed with the use of a photomask, the photomask including a transparent substrate; an opaque film formed on the transparent substrate, wherein the opaque film is configured to form the device pattern on a wafer as the wafer is exposed to the light; and at least one pair of assist patterns formed by the opaque film in such a manner as to be adjacent to the device pattern on the transparent substrate, wherein a size of each assist pattern of the pair of assist patterns is such that the assist pattern will not be resolved on the wafer, wherein a part of each assist pattern of the pair of assist patterns includes step portions.

According to another aspect of an embodiment, there is a method of manufacturing a photomask, wherein the photomask includes a transparent substrate; an opaque film formed on the transparent substrate, wherein the opaque film is configured to form a device pattern on a wafer as the wafer is exposed to light; and at least one pair of assist patterns formed by the opaque film in such a manner as to be adjacent to the device pattern on the transparent substrate, wherein a size of each assist pattern of the pair of assist patterns is such that the assist pattern will not be resolved on the wafer, wherein a part of each assist pattern of the pair of assist patterns includes step portions, the method including a measurement step of measuring an inter-pattern distance between the device patterns in pattern data; a determination step of determining, according to the inter-pattern distance, a number of said at least one pair of assist patterns, a shape of each assist pattern, and a location for arranging each assist pattern on the photomask, by referring to a table, wherein the table includes a relationship between the inter-pattern distance, a number of assist patterns without the step portions, and a location for arranging each assist pattern without the step portions, and a relationship between the inter-pattern distance, a number of assist patterns including the step portions, and a location for arranging each assist pattern including the step portions; and a creation step of creating a mask pattern according to contents determined in the determination step.

BRIEF DESCRIPTION OF THE DRAWINGS

Other objects, features and advantages of the present invention will become more apparent from the following detailed description when read in conjunction with the accompanying drawings, in which:

FIG. 5B is a specific example of a photomask pattern with assist patterns, which is described with reference to FIG. 4;

FIG. 15D illustrates yet another photomask pattern according the fourth embodiment of the present invention;

DETAILED DESCRIPTION OF THE PREFERRED EMBODIMENTS

A description is given, with reference to the accompanying drawings, of an embodiment of the present invention.

[Principle]

Figure 7A:
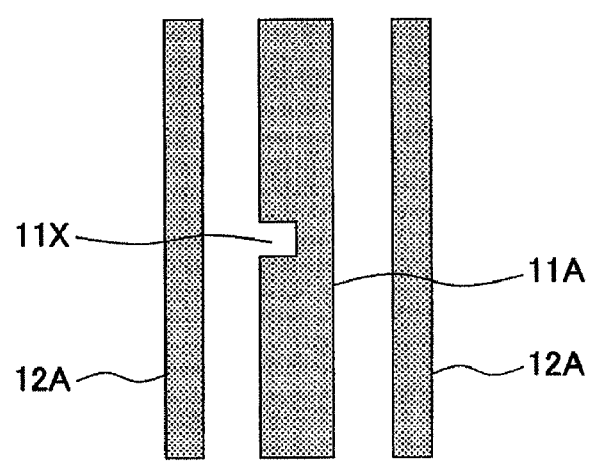
FIG. 7A illustrates an example of a defect in a photomask.
Figure 7B:
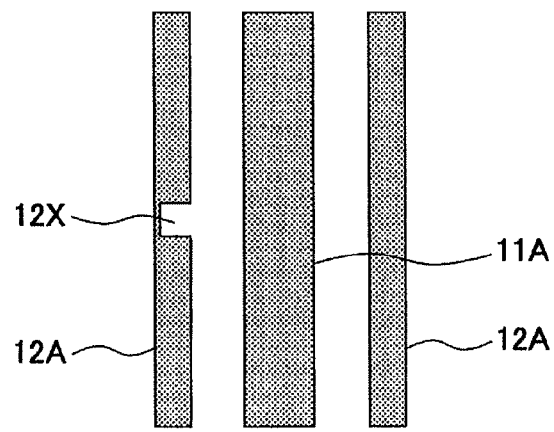
FIG. 7B illustrates another example of a defect in a photomask.

As described with reference to FIGS. 7A and 7B, a defect in a photomask may occur in a primary pattern or in an assist pattern.

Accordingly, the inventor of the present invention conducted research as a basis of the present invention. Specifically, it was examined as to how the relationship between focus positions and critical dimensions (CD) changes according to whether the defect has occurred in the primary pattern or in the assist pattern.

Figure 8:
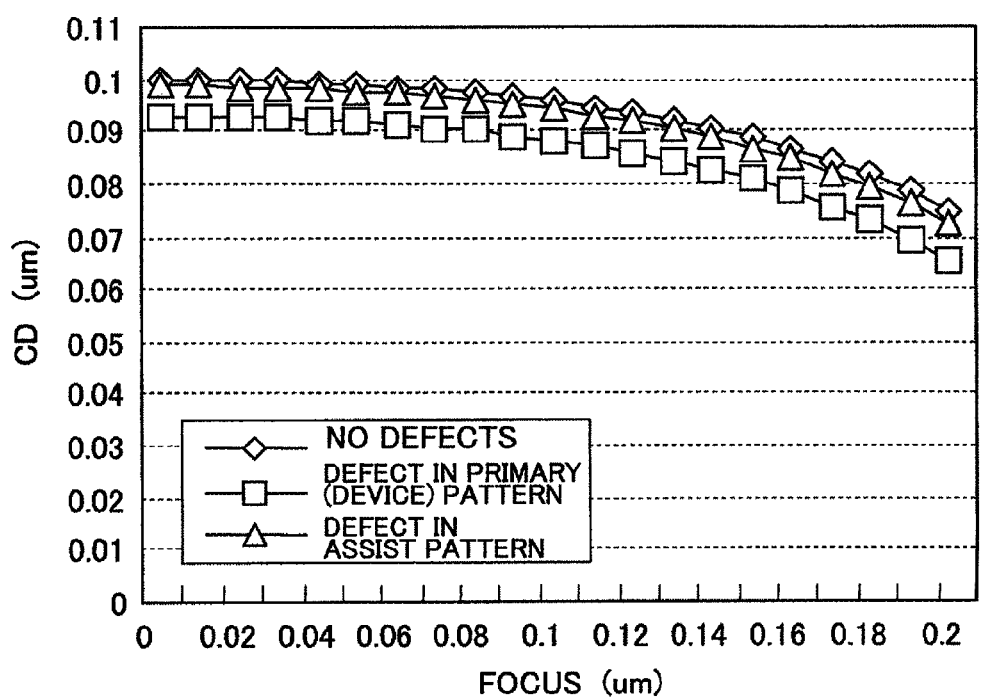
FIG. 8 illustrates changes in critical dimensions according to different statuses of defects in a photomask.

FIG. 8 illustrates results of the examination. In FIG. 8, ◇ indicates a case where there are no defects, □ indicates a case where the defect 11X is in the primary pattern 11A as shown in FIG. 7A, and Δ indicates a case where the defect 12X is in the assist pattern 12A as shown in FIG. 7B.

Referring to FIG. 8, when the defect 12X is in the assist pattern 12A, the critical dimensions of patterns formed on a wafer by exposure are not much different from those in the case where there are no defects in the photomask. However, when the defect 11X is in the primary pattern 11A, the critical dimensions of the light exposing patterns are greatly affected. This is probably reflects the fact that the assist pattern 12A is not actually resolved on the wafer, whereas the primary pattern 11A is actually formed on the wafer by exposure.

Figure 6A:
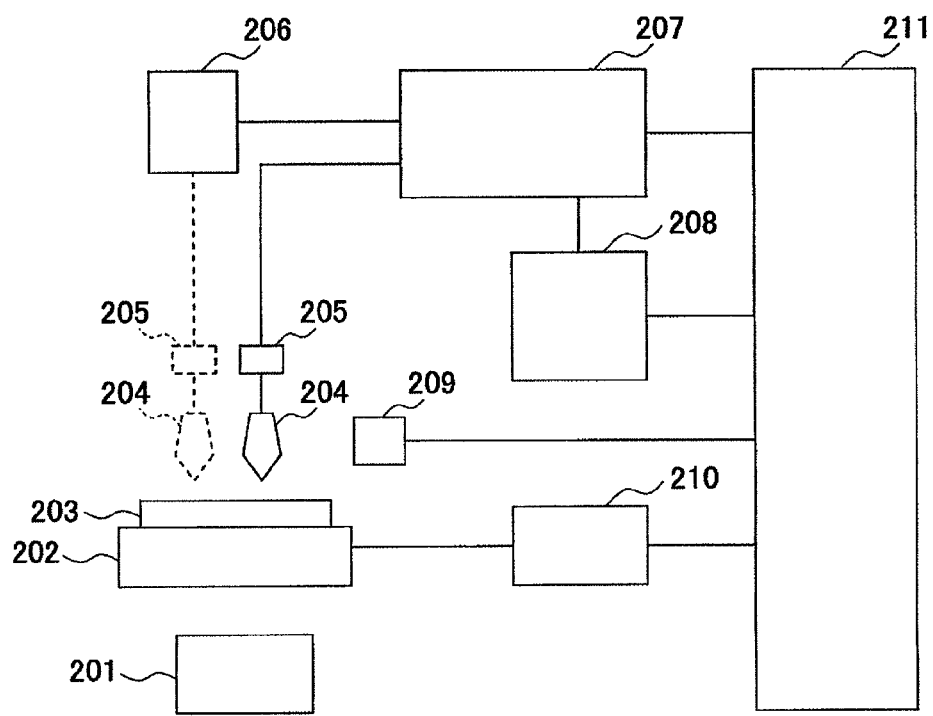
FIG. 6A illustrates a process for inspecting a photomask (part 1)
Figure 6B:
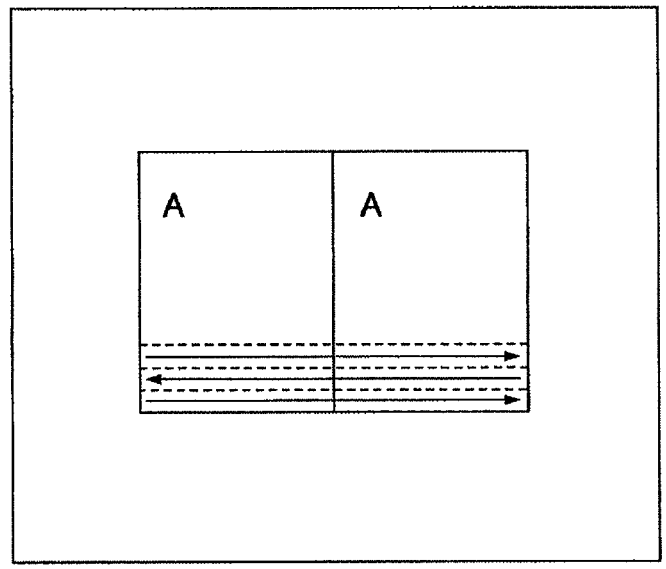
FIG. 6B illustrates a process for inspecting a photomask (part 2)

Hence, in the inspection process for photomasks such as that described with reference to FIGS. 6A and 6B, in a case where the operator is required to confirm the defect by visual inspection, if the operator can distinguish the assist pattern from the primary pattern at a glance, the operator will be able to disregard the assist pattern and confirm only the primary pattern. Therefore, inspection efficiencies can be enhanced and the workload can be reduced.

The assist pattern is slightly thinner than the primary pattern. Thus, theoretically, the operator should be able to distinguish the assist pattern from the primary pattern by carefully confirming the widths of the patterns, in performing visual inspections by the conventional method. However, in reality, it is difficult to distinguish the assist patterns one after the other on the confirmation screen. Hence, under practical circumstances, the operator inevitably inspects all of the patterns on the confirmation screen without distinguishing the assist patterns from the primary patterns.

First Embodiment

Figure 9:
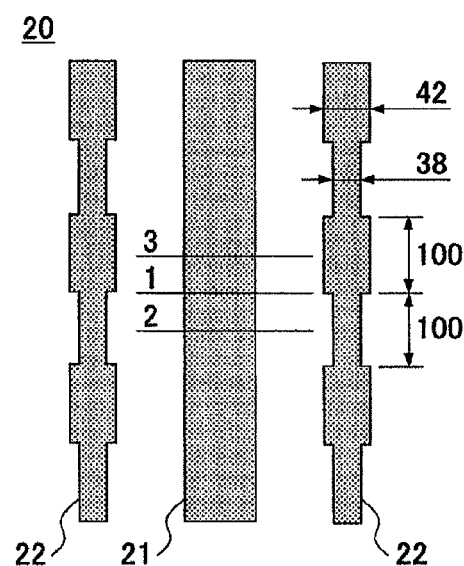
FIG. 9 illustrates a photomask pattern according a first embodiment of the present invention.

FIG. 9 is a pattern of a photomask according to a first embodiment of the present invention.

Referring to FIG. 9, a photomask 20 includes a primary pattern 21, and a pair of assist patterns 22, one assist pattern 22 on either side of the primary pattern 21 spaced apart from the primary pattern 21 by 100 nm, which assist patterns 22 each have a width of 40 nm. In the present embodiment, at the edges of the assist pattern 22, there are provided 2 nm-sized steps to make it easier for the operator to make visual inspections.

That is, the assist pattern 22 includes a narrow portion 2 and a wide portion 3 on either side of a step portion 1. The narrow portion 2 and the wide portion 3 are alternately provided along the assist pattern 22, each part having a length of, for example, 100 nm on a wafer (a length of 400 nm on the photomask). The width of the narrow portion 2 is, for example, 38 nm on a wafer (152 nm on the photomask), and the width of the wide portion 3 is, for example, 42 nm on a wafer (168 nm on the photomask). However, in the actual exposing operation, the assist pattern 22 is not resolved on a wafer.

By providing steps along the edges of the assist pattern 22, the operator can distinguish the assist pattern from the primary at a glance while visually inspecting the photomask, and therefore, the operator can concentrate on identifying a defect in the primary pattern.

Figure 10A:
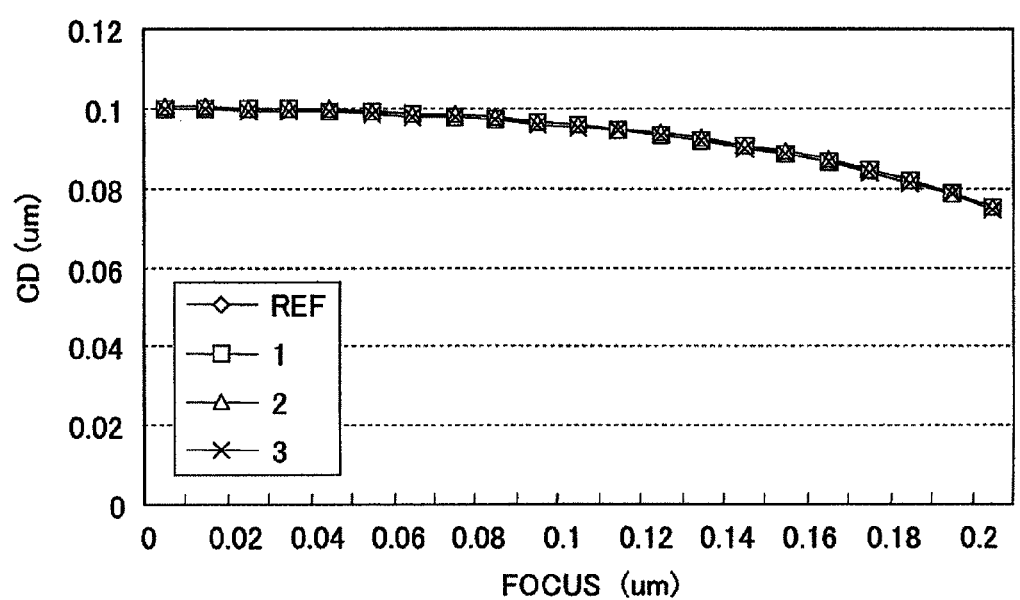
FIG. 10A illustrates the relationships between critical dimensions and focus positions in the case of using the photomask pattern shown in FIG. 9.

FIG. 10A illustrates the relationships between focus positions and critical dimensions (CD) when step portions are formed in the assist patterns 22.

Referring to FIG. 10A, the data indicated as "REF" correspond to critical dimensions in a case where no step portions are formed in the assist pattern 12A, the data indicated as "1" correspond to critical dimensions of the primary pattern 21 at positions corresponding to the step portions 1, the data indicated as "2" correspond to critical dimensions of the primary pattern 21 at positions corresponding to the narrow portions 2, and the data indicated as "3" correspond to critical dimensions of the primary pattern 21 at positions corresponding to the wide portions 3.

FIG. 10A indicates that that even when step portions are formed in the assist patterns 12A, the critical dimensions of the primary pattern 21 on a wafer are substantially unchanged, that is, exposure is substantially unaffected.

Figure 10B:
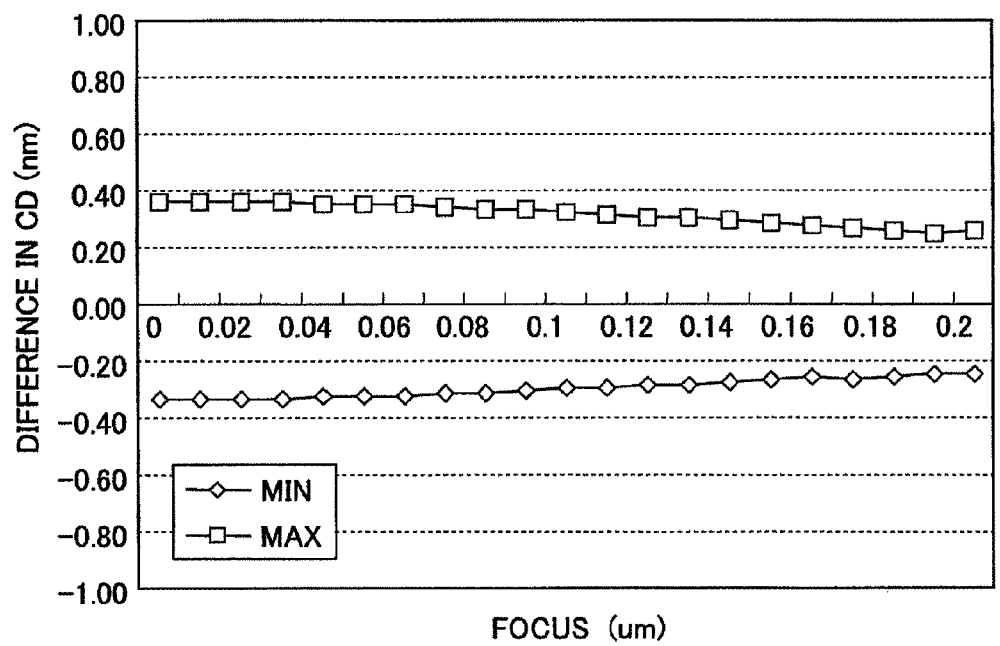
FIG. 10B illustrates the maximum values and the minimum values of the differences in the critical dimensions in the exposure pattern in the case of using the photomask pattern shown in FIG. 9.

FIG. 10B illustrates functions of focus positions representing the maximum (MAX) and the minimum (MIN) differences among the differences in the critical dimensions at the positions 1, 2, and 3 with respect to the reference pattern (REF).

FIG. 10B indicates that even when the focus changes and the focus position shifts from the just focus position, the maximum value and the minimum value of the above-described critical dimensions are substantially unchanged.

Second Embodiment

Figure 11:
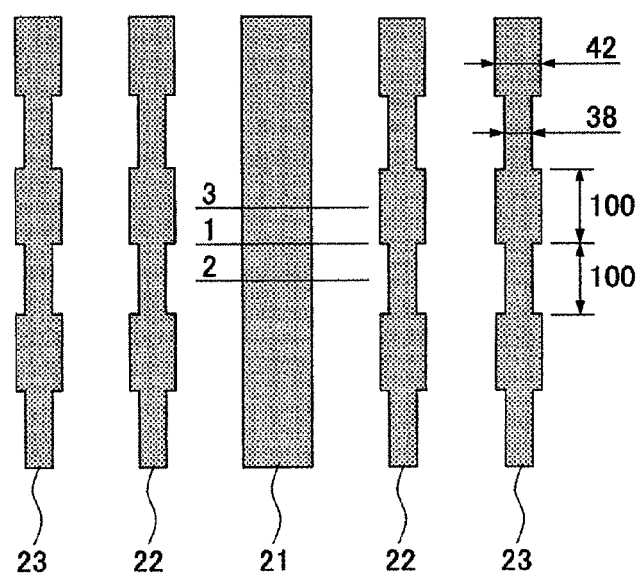
FIG. 11 illustrates a photomask pattern according a second embodiment of the present invention.

FIG. 11 is a pattern of a photomask 40 according to a second embodiment of the present invention. In FIG. 11, elements corresponding to those described above are denoted by the same reference numbers, and are not further described.

Referring to FIG. 11, the photomask 40 according to the present embodiment has a pair of assist patterns 23, which assist patterns 23 are the same as the assist patterns 22, provided outside of the pair of assist patterns 22 of the photomask 20 shown in FIG. 9, in such a manner as to be spaced apart from the assist patterns 22 by 100 nm on a wafer. That is, the assist patterns 23 have a width of 40 nm on a wafer, and 2 nm-sized steps are formed along both edges thereof.

Figure 12A:
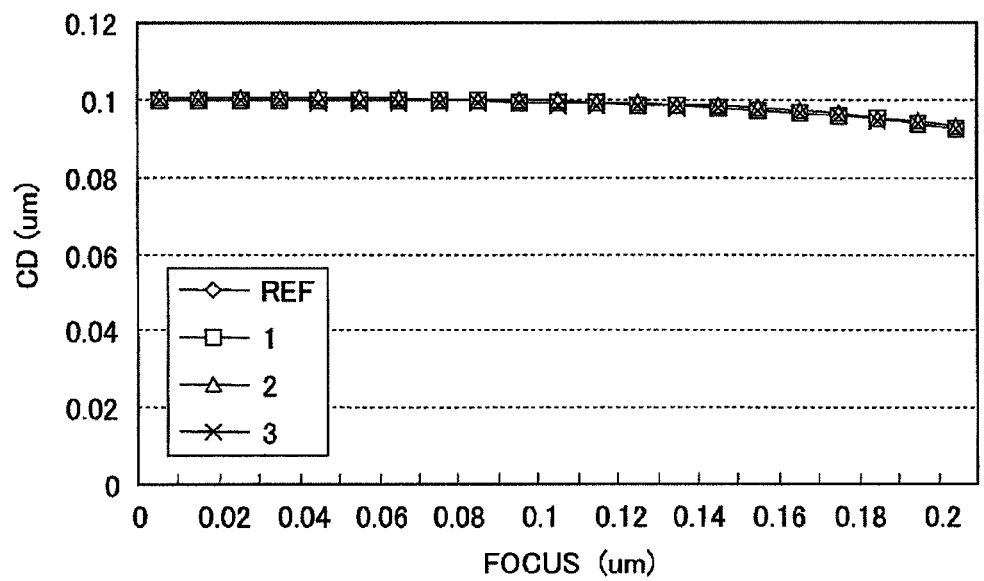
FIG. 12A illustrates the relationships between critical dimensions and focus positions in the case of using the photomask pattern shown in FIG. 11.

FIG. 12A is similar to FIG. 10A, illustrating the relationships between focusing positions and critical dimensions (CD) of patterns corresponding to the primary pattern 22 formed on a wafer by exposure with the use of the photomask 40 shown in FIG. 11. This diagram says that the relationships between the critical dimensions and the focusing positions at the step portion 1, the narrow portion 2, and the wide portion 3 are unchanged with respect to the reference pattern (REF).

Figure 12B:
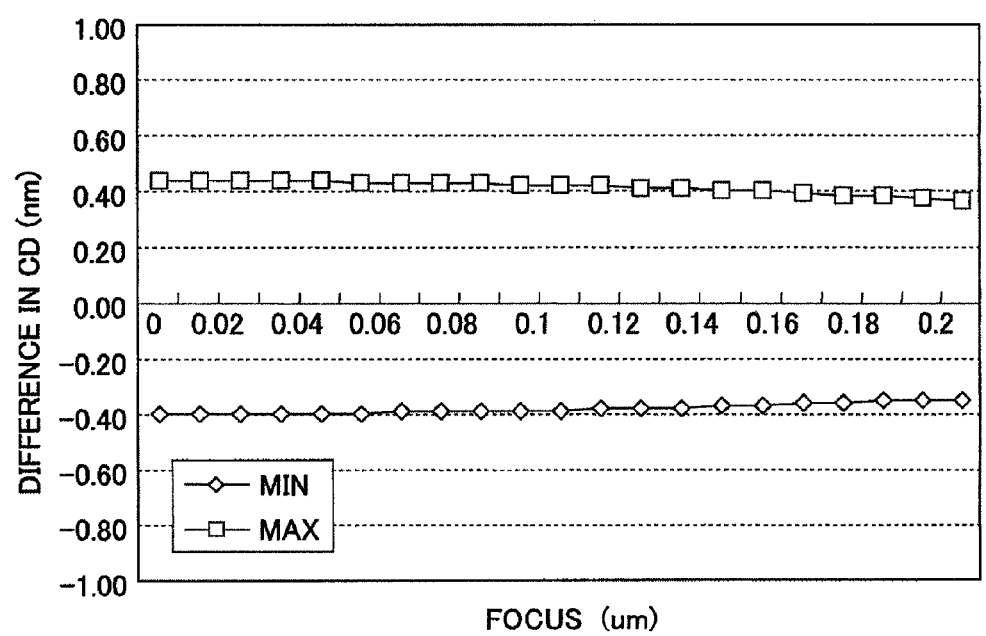
FIG. 12B illustrates the maximum values and the minimum values of the differences in the critical dimensions in the exposure pattern in the case of using the photomask pattern shown in FIG.

FIG. 12B corresponds to FIG. 10B, illustrating the maximum values (MAX) and the minimum values (MIN) of the differences in the critical dimensions at the positions 1, 2, and 3 with respect to the reference pattern (REF). This diagram says that the maximum values and the minimum values are substantially unchanged at different focusing positions.

Third Embodiment

Figure 13:
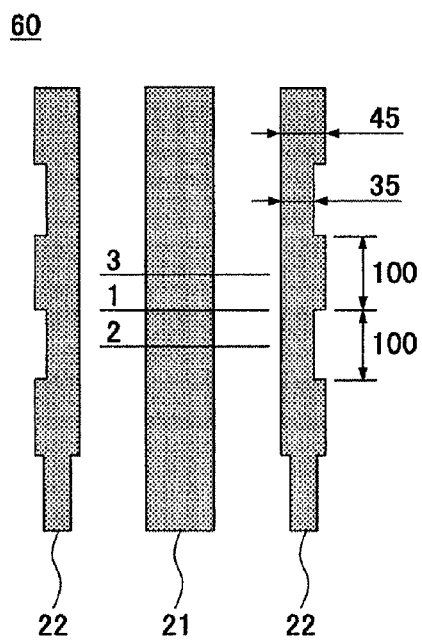
FIG. 13 illustrates a photomask pattern according a third embodiment of the present invention.

FIG. 13 is a pattern of a photomask 60 according to a third embodiment of the present invention. In FIG. 13, elements corresponding to those described above are denoted by the same reference numbers, and are not further described.

Referring to FIG. 13, the photomask 60 according to the present embodiment has the same configuration as that of the photomask 20 shown in FIG. 9; however, the step portions, which are 5 nm on a wafer (20 nm on the photomask), are only provided on the outer edges of the assist patterns 22, i.e., on the edge further away from the primary pattern 21. The step portions are formed at intervals of 100 nm on a wafer (intervals of 400 nm on the photomask).

Figure 14A:
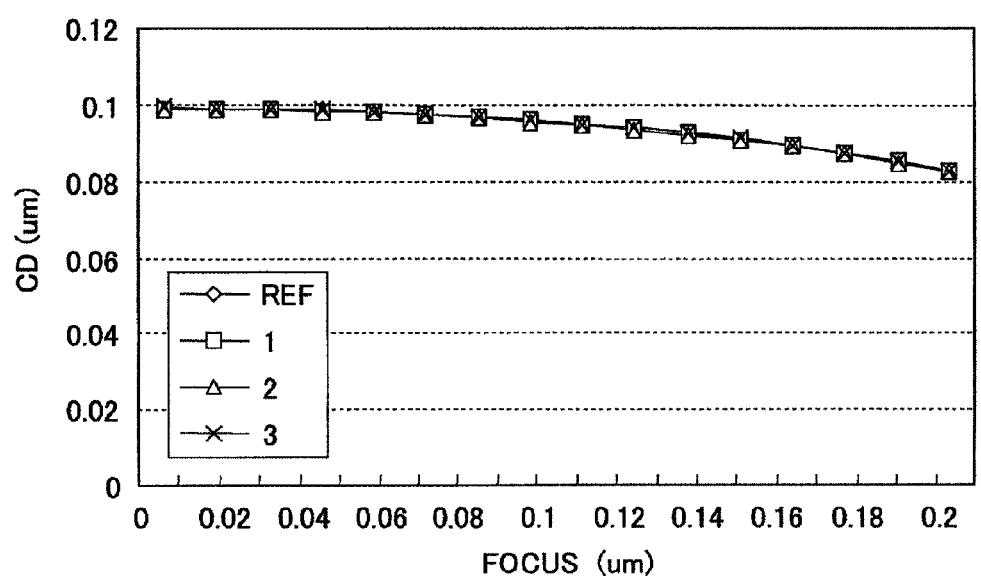
FIG. 14A illustrates the relationships between critical dimensions and focus positions in the case of using the photomask pattern shown in FIG. 13.

FIG. 14A is similar to FIG. 10A, illustrating the relationships between focusing positions and critical dimensions (CD) of patterns corresponding to the primary pattern 22 formed on a wafer by exposure with the use of the photomask 60 shown in FIG. 13. This diagram says that the relationships between the critical dimensions and the focusing positions at the step portion 1, the narrow portion 2, and the wide portion 3 are unchanged with respect to the reference pattern (REF).

Figure 14B:
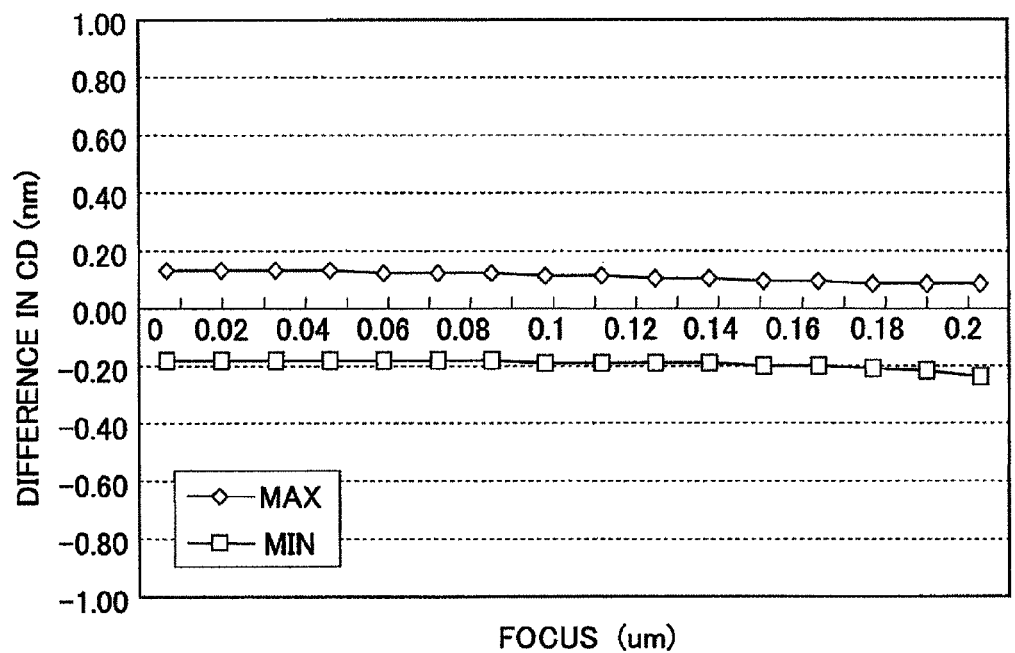
FIG. 14B illustrates the maximum values and the minimum values of the differences in the critical dimensions in the exposure pattern in the case of using the photomask pattern shown in FIG. 13.

FIG. 14B corresponds to FIG. 10B, illustrating the maximum values (MAX) and the minimum values (MIN) of the differences in the critical dimensions at the positions 1, 2, and 3 with respect to the reference pattern (REF). This diagram says that the maximum values and the minimum values are substantially unchanged at different focusing positions.

With the photomask 60 according to the present embodiment, the differences between the maximum values and the minimum values of the critical dimensions are particularly small compared to those of the other embodiments. Therefore, in the present embodiment, adverse effects on the light exposing patterns are minimized.

Fourth Embodiment

In the above, the procedure of adding assist patterns to a primary pattern is described with reference to FIG. 3 and Table 1 for a case where there are no steps formed in the assist patterns. In a case where there are steps formed in the assist patterns as in the present invention, the rules shown in Table 1 need to be changed appropriately according to whether the steps are formed on both edges of the assist pattern, the steps are formed only on the right edge of the assist pattern, the steps are formed only on the left edge of the assist pattern, or no steps are formed in the assist pattern.

Figure 1A:
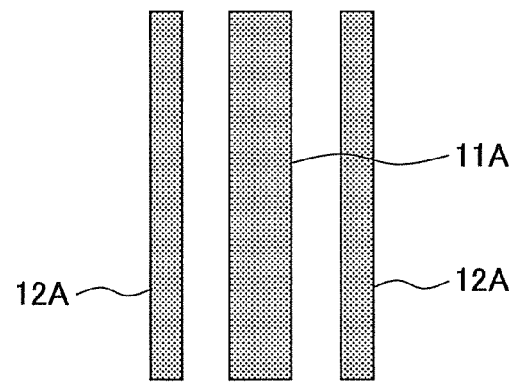
FIG. 1A illustrates an example of a conventional photomask pattern with assist patterns.
Figure 1B:
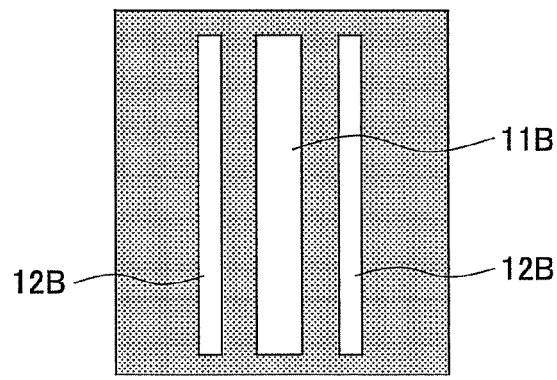
FIG. 1B illustrates another example of a conventional photomask pattern with assist patterns.
Figure 2A:
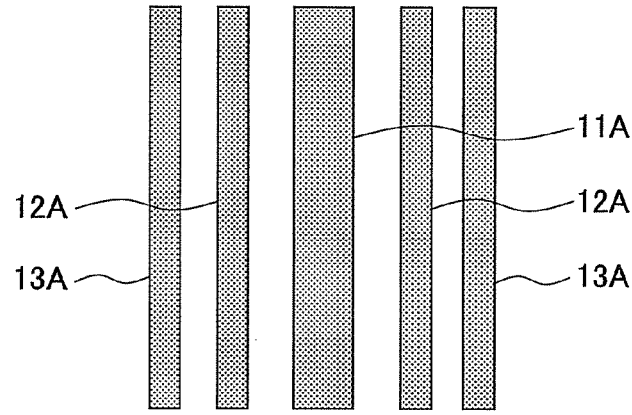
FIG. 2A illustrates yet another example of a conventional photomask pattern with assist patterns.
Figure 2B:
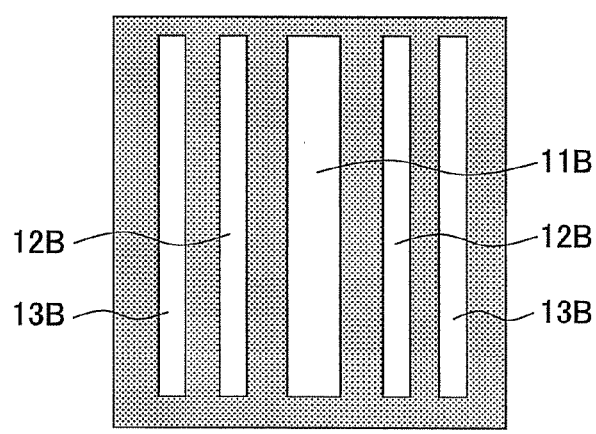
FIG. 2B illustrates yet another example of a conventional photomask pattern with assist patterns.
Figure 3:
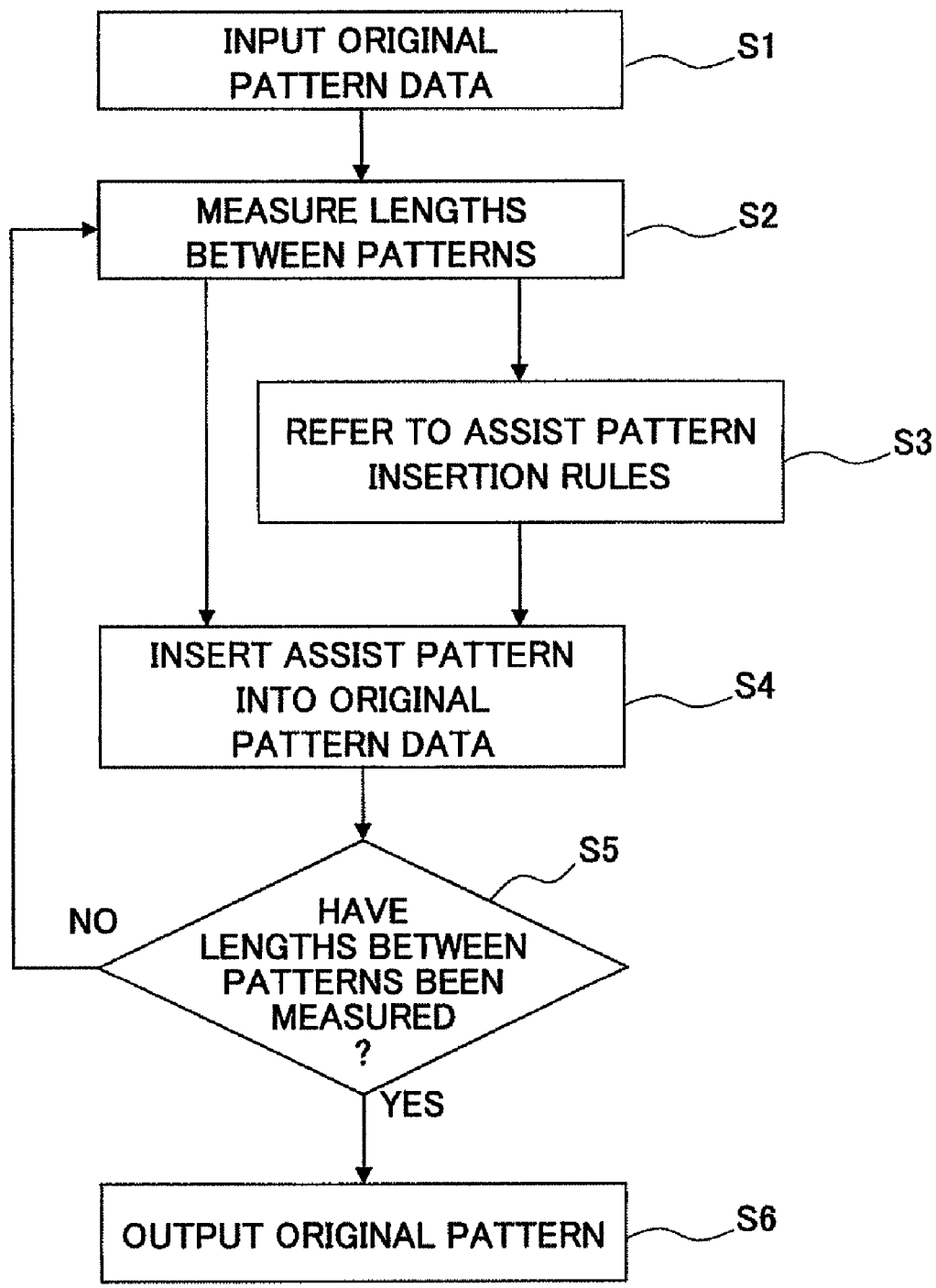
FIG. 3 is a flowchart of a procedure of adding assist patterns to a primary pattern.
Figure 4:
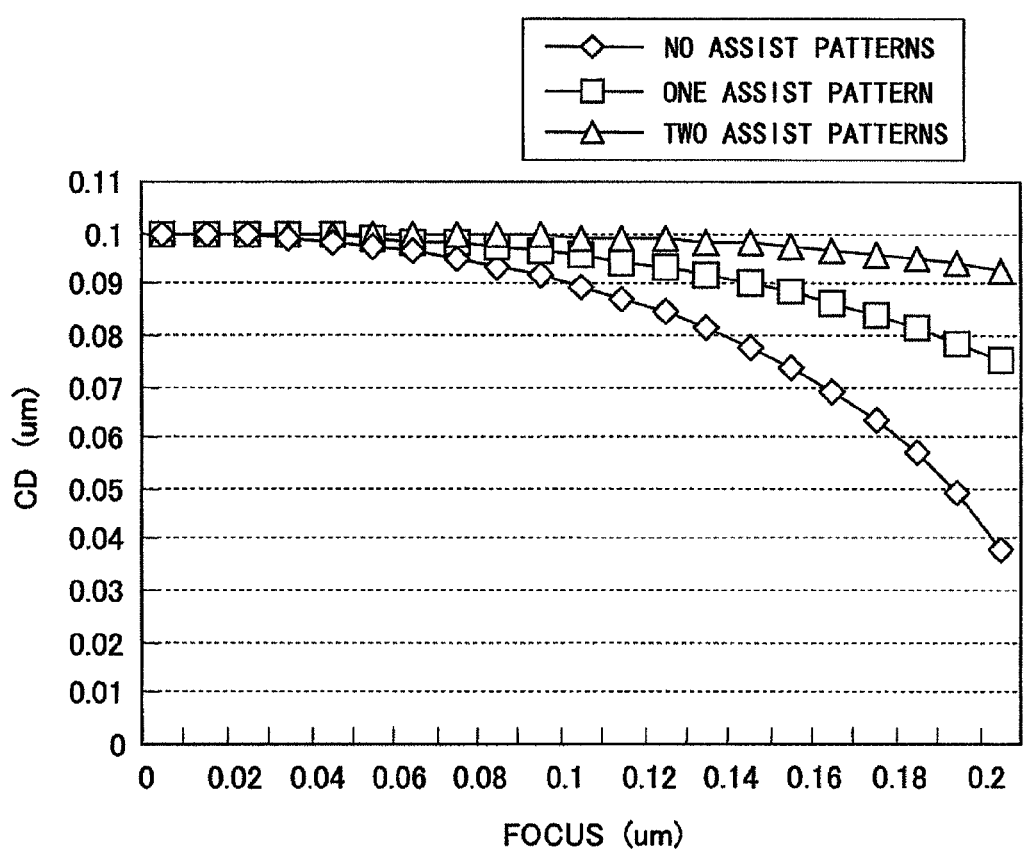
FIG. 4 illustrates effects of the assist patterns.
Figure 5A:
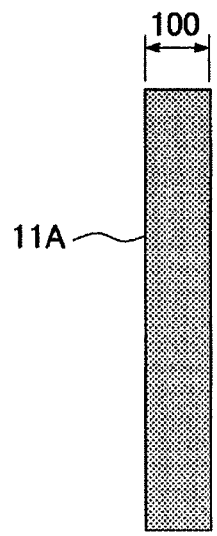
FIG. 5A is a specific example of a photomask pattern, which is described with reference to FIG. 4.
Figure 5A:
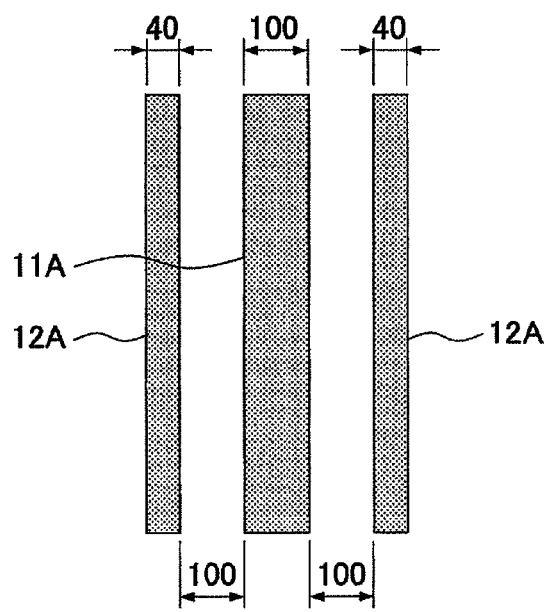
Figure 5C:
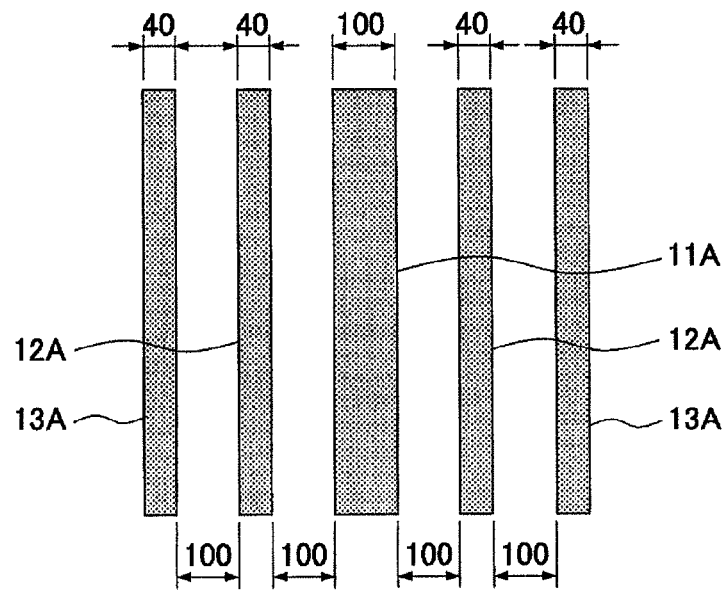
FIG. 5C is another specific example of a photomask pattern with assist patterns, which is described with reference to FIG. 4.

In the following, examples of methods of adding assist patterns by the procedure shown in FIG. 3 are described for various photomask patterns as shown in FIGS. 15A through 15D. In each of the examples shown in FIGS. 15A through 15D, the assist patterns 22 are added near two primary patterns 21.

In patterns 80A through 80D illustrated in FIGS. 15A through 15D, the assist patterns 22 are one of the following patterns. That is, the assist pattern 22 is a pattern (SB1) having steps on both edges, a pattern (SB2) without steps, a pattern (R-SB1, R-SB2) with steps only on the left edge, or a pattern (L-SB1, L-SB2) with steps only on the right edge. These assist patterns 22 are arranged according to the rules shown in Tables 3 and 4.

TABLE 3

| Pattern intervals D (nm) | No. of assist patterns | L-SB1 | L-SB2 | R-SB2 | R-SB1 | SB1 | SB2 |
|---|---|---|---|---|---|---|---|
| 660 ≤ D | 4 | C | E | E | D | — | — |
| 520 ≤ D < 660 | 3 | C | — | — | D | — | B |
| 380 ≤ D < 520 | 2 | C | — | — | D | — | — |
| 240 ≤ D < 380 | 1 | — | — | — | — | A | — |
| D < 240 | 0 | — | — | — | — | — | — |

TABLE 4

| Type (indicated in Table 3) | Location for arranging assist patterns |
|---|---|
| A | At center between primary (device) patterns |
| B | At center between assist patterns |
| C | 100 nm away from primary (device) pattern |
| D | 100 nm away from primary (device) pattern |
| E | 100 nm away from first pair of assist patterns |

Figure 15A:
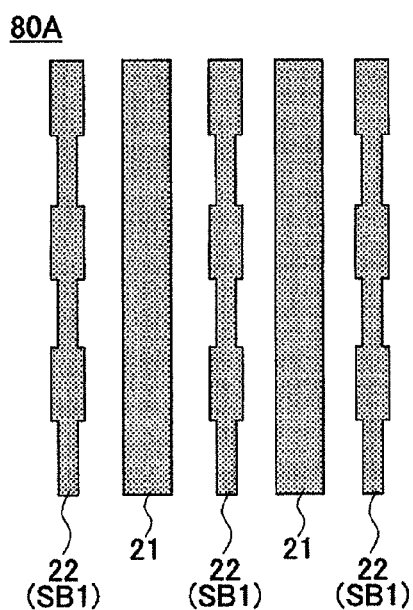
FIG. 15A illustrates a photomask pattern according a fourth embodiment of the present invention.
Figure 15B:
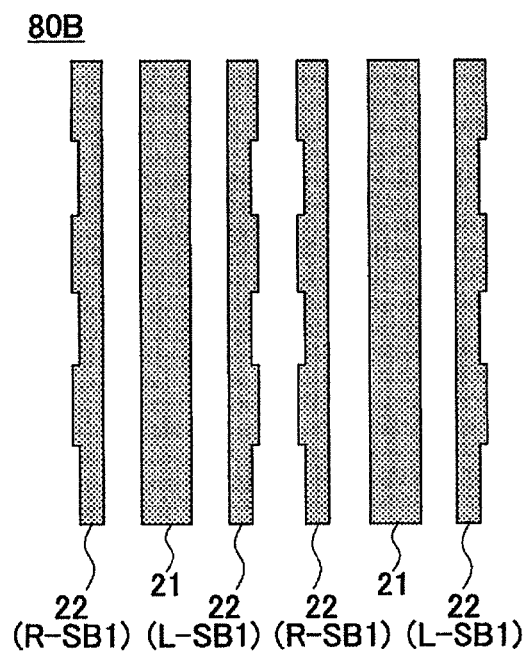
FIG. 15B illustrates another photomask pattern according the fourth embodiment of the present invention.
Figure 15C:
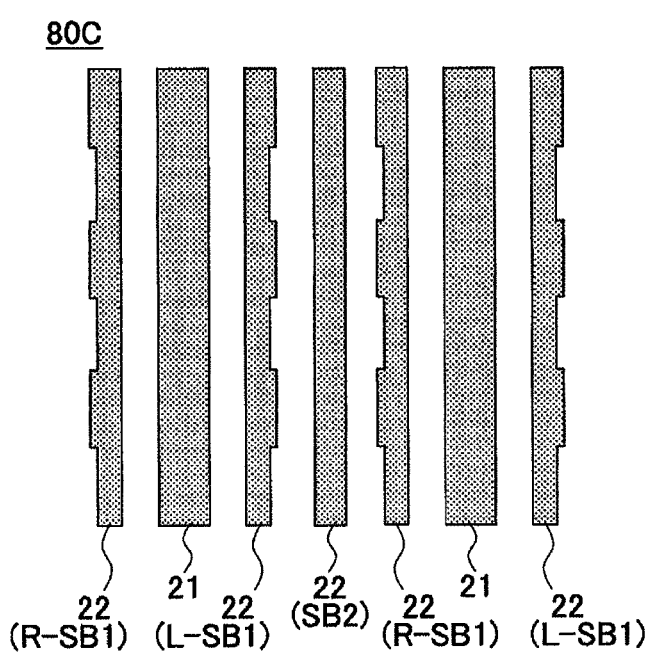
FIG. 15C illustrates yet another photomask pattern according the fourth embodiment of the present invention.

With these configurations, even if assist patterns without any step portions (SB2) are used as shown in FIG. 15C or 15D, such assist patterns will be marked by the side edges of the assist patterns (L-SB1, R-SB1) having step portions. Accordingly, the operator will be able to easily distinguish the assist patterns 22 from the primary patterns 21, even for the assist patterns without any step portions.

The rules in Tables 3 and 4 are determined beforehand so as to minimize the adverse effects caused by forming step portions in the assist patterns, which adverse effects are inflicted on the critical dimensions of the element patterns formed on a wafer by exposure or the focusing margins.

Accordingly, it is possible to insert the assist patterns at optimal positions in the photomask pattern simply by referring to these tables.

Fifth Embodiment

FIGS. 16A through 16F illustrate a procedure for fabricating a halftone mask with the use of a pattern according to the present invention.

Figure 16A:
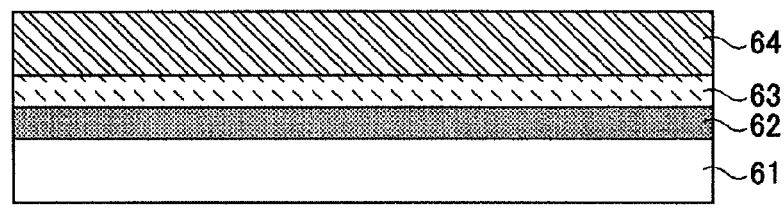
FIG. 16A illustrates a procedure for manufacturing a photomask according to a fifth embodiment of the present invention (part 1)

Referring to FIG. 16A, on a quartz glass substrate 61, a halftone film 62 having a transmittance of 6% and a Cr film 63 are sequentially formed. On the Cr film 63 is formed a resist film 64.

Figure 16B:
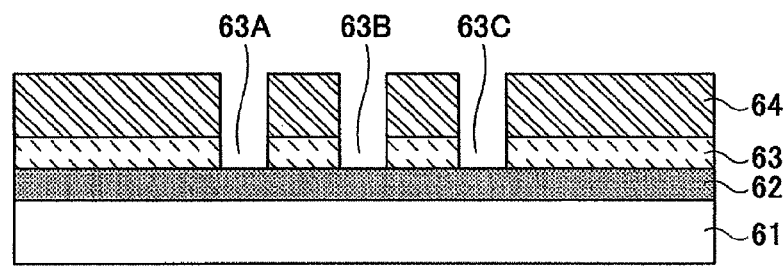
FIG. 16B illustrates the procedure for manufacturing a photomask according to the fifth embodiment of the present invention (part 2)

Next, in the step shown in FIG. 16B, the resist film 64 is subjected to patterning by being exposed to electronic light beams. The resist film 64 having been subjected to patterning is then used as a mask to dryetch the Cr film 63, thereby forming openings 63A, 63B, and 63C in the Cr film 63.

Figure 16C:
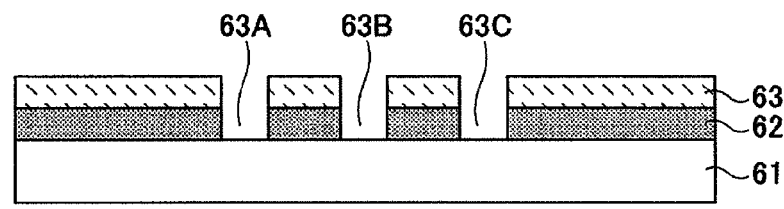
FIG. 16C illustrates the procedure for manufacturing a photomask according to the fifth embodiment of the present invention (part 3)

Next, in the step shown in FIG. 16C, the resist film 64 is removed and the Cr film 63 is used as a mask to dryetch the halftone film 62 beneath the Cr film 63, thereby forming openings 62A, 62B, and 62C in the halftone film 62.

Figure 16D:
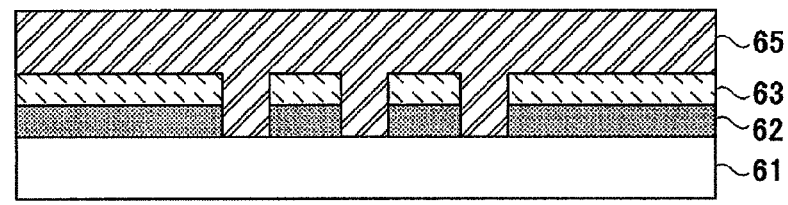
FIG. 16D illustrates the procedure for manufacturing a photomask according to the fifth embodiment of the present invention (part 4)
Figure 16E:
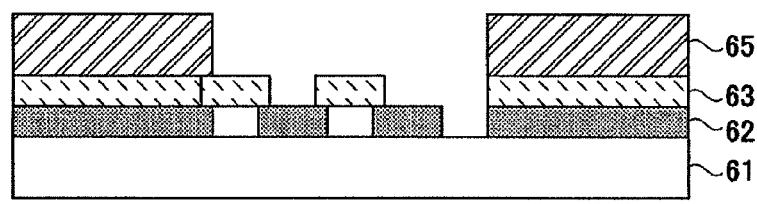
FIG. 16E illustrates the procedure for manufacturing a photomask according to the fifth embodiment of the present invention (part 5)
Figure 16F:
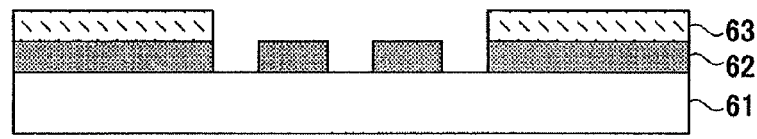
FIG. 16F illustrates the procedure for manufacturing a photomask according to the fifth embodiment of the present invention (part 6)

Then, in the step shown in FIG. 16D, a resist film 65 is formed on the structure shown in FIG. 16C. In the step shown in FIG. 16E, this is subjected to patterning in such a manner that a part of the Cr film 63 is exposed. In the step shown in FIG. 16F, the resist film 65 is used as a mask to remove the exposed Cr film 63. Thus, a desired super-resolution photomask is formed.

With the use of the photomask fabricated in this manner, when an operator confirms defects by visual inspection, the operator can distinguish, at a glance, a primary pattern that is to be actually formed on a wafer by exposure from an assist pattern that is not to be actually formed. Accordingly, the efficiency in fabricating photomasks can be enhanced.

The present invention is not limited to the process of a manufacturing a halftone photomask as shown in FIGS. 16A through 16F; the present invention is also useful for manufacturing a binary photomask.

Sixth Embodiment

In the following, as a sixth embodiment, a description is given of an example of forming a semiconductor device pattern on a silicon substrate by a photolithography procedure with the use of the above described halftone photomask, with reference to FIGS. 17A through 17D.

Figure 17A:
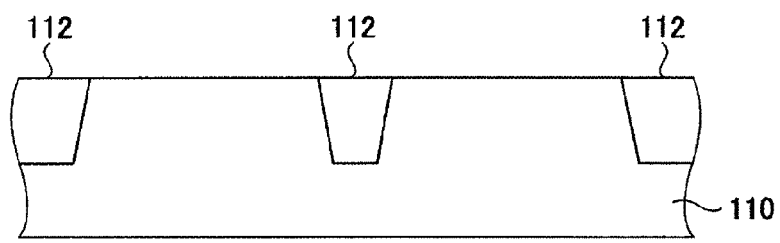
FIG. 17A illustrates a procedure for manufacturing a semiconductor device according a sixth embodiment of the present invention (part 1)

Referring to FIG. 17A, an STI (shallow trench isolation) method is performed to form trenches having depths of 300 nm in a silicon substrate 110, and element separation films 112 to fill in the trenches are formed. However, in FIG. 17A, the region on the left side of the center element separation film 112 is to be used as a device region for an n-channel MOS transistor, and the region on the right side is to be used as a device region for a p-channel MOS transistor.

Figure 17B:
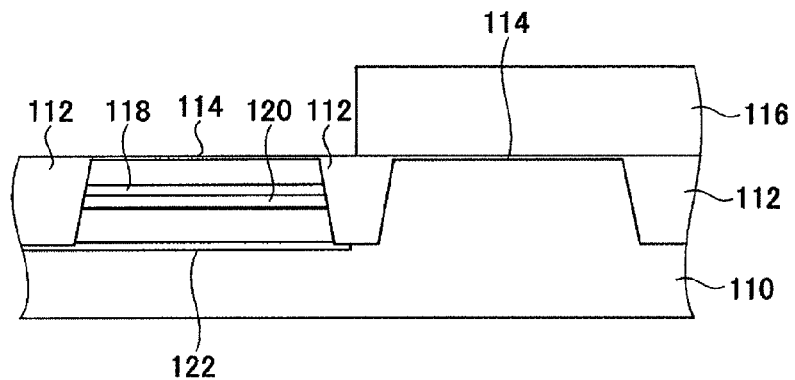
FIG. 17B illustrates a procedure for manufacturing a semiconductor device according the sixth embodiment of the present invention (part 2)

Next, in the step shown in FIG. 17B, a thermal oxidation method is performed to form a sacrificial oxide film 114 on the silicon substrate 110. Furthermore, by performing a photolithography process, a photoresist film 116 is formed in such a manner that it exposes the device region for the n-channel MOS transistor and covers the device region for the p-channel MOS transistor.

Furthermore, in the step shown in FIG. 17B, the photoresist film 116 is used as a mask to inject ions, so that p-type impurity diffusion regions 118, 120, and 122 are formed in the silicon substrate 110 in the device region for the n-channel MOS transistor.

The p-type impurity diffusion region 118 is formed by, for example, injecting indium ions (In+) by a dose amount of $1 \times 10^{13}$ cm$^{-2}$ under the acceleration energy of 60 keV. The p-type impurity diffusion region 120 is formed by, for example, injecting indium ions by a dose amount of $3 \times 10^{13}$ cm$^{-2}$ under the acceleration energy of 180 keV. The p-type impurity diffusion region 122 is formed by, for example, injecting boron ions (B+) by a dose amount of $3 \times 10^{13}$ cm$^{-2}$ under the acceleration energy of 150 keV.

Figure 17C:
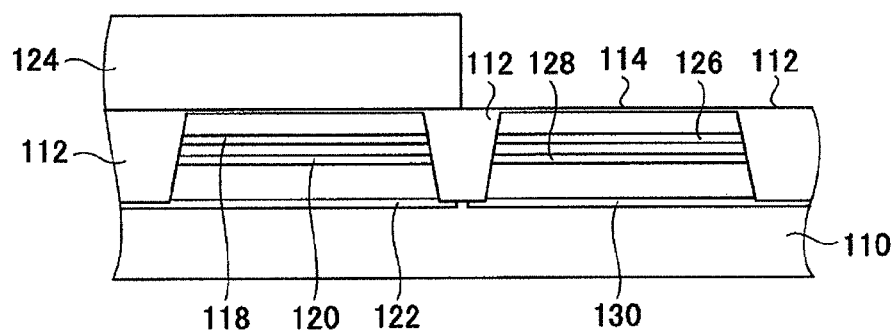
FIG. 17C illustrates a procedure for manufacturing a semiconductor device according the sixth embodiment of the present invention (part 3)

In the step shown in FIG. 17C, by performing a photolithography process, a photoresist film 124 is formed in such a manner that it exposes the device region for the p-channel MOS transistor and covers the device region for the n-channel MOS transistor.

Furthermore, in the step shown in FIG. 17C, the photoresist film 124 is used as a mask to inject ions, so that n-type impurity diffusion regions 126, 128, and 130 are formed in the silicon substrate 110 in the device region for the p-channel MOS transistor.

The n-type impurity diffusion region 126 is formed by, for example, injecting arsenic ions (As+) by a dose amount of $5 \times 10^{12}$ cm$^{-2}$ under the acceleration energy of 100 keV. The n-type impurity diffusion region 128 is formed by, for example, injecting arsenic ions by a dose amount of $3 \times 10^{13}$ cm$^{-2}$ under the acceleration energy of 150 keV. The n-type impurity diffusion region 130 is formed by, for example, injecting phosphorus ions (P+) by a dose amount of $3 \times 10^{13}$ cm$^{-2}$ under the acceleration energy of 300 keV.

In the step shown in FIG. 17C, the sacrificial oxide film 114 is removed by performing wetetching with the use of a hydrofluoric aqueous solution, so that the surface of the silicon substrate 110 is exposed.

Figure 17D:
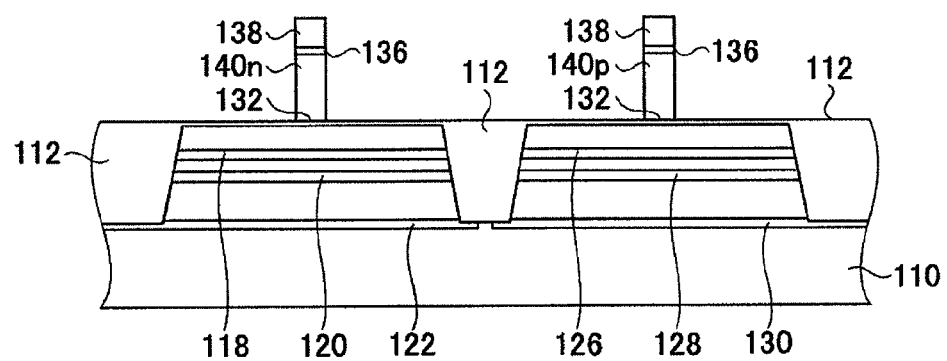
FIG. 17D illustrates a procedure for manufacturing a semiconductor device according the sixth embodiment of the present invention (part 4)

In the step shown in FIG. 17D, by performing a thermal oxidation method or the like, a silicon oxide film with a film thickness of 11 nm is caused to grow on a silicon substrate surface exposed by removing the sacrificial oxide film 114 in the step shown in FIG. 17C. Accordingly, a gate dielectric film 132 is formed, which is a silicon oxide film.

Polysilicon films (not shown), each having a thickness of 100 nm are deposited on the gate dielectric film 132 by performing a CVD (chemical vapor deposition) method or the like. Organic antireflection films 136 each having a thickness of around 80 nm are formed on the polysilicon films. Furthermore, an ArF-type posi-type resist, which is a photosensitive material, is applied to have a thickness of 250 nm through 300 nm.

Then, the silicon substrate 110 that is a silicon wafer is exposed to light so that a pattern of the above-described photomask is formed thereon. The light is irradiated with the use of a reduced projection exposure device including an ArF excimer laser as the light source. As to the exposure conditions, the amount of exposed light is 210 J/cm$^2$ in a case where a ½ orbicular zone illumination (σ value: 0.425/0.85) is used with a numerical aperture (NA) of 0.7.

Next, in the step shown in FIG. 17D, the resist film is subjected to a heating process (PEB: Post Exposure Bake) and a developing process to perform patterning on the resist film, thereby forming a resist pattern 138. Then, the resist pattern 138 is used as a mask for dry-etching the organic antireflection film 136, the polysilicon film, and the gate dielectric film 132, thereby forming gate electrodes 140*n* and 140*p* that are polysilicon films. The gate electrode 140*n* is a gate electrode of an n-channel MOS transistor and the gate electrode 140*p* is a gate electrode of a p-channel MOS transistor.

Figure 17E:
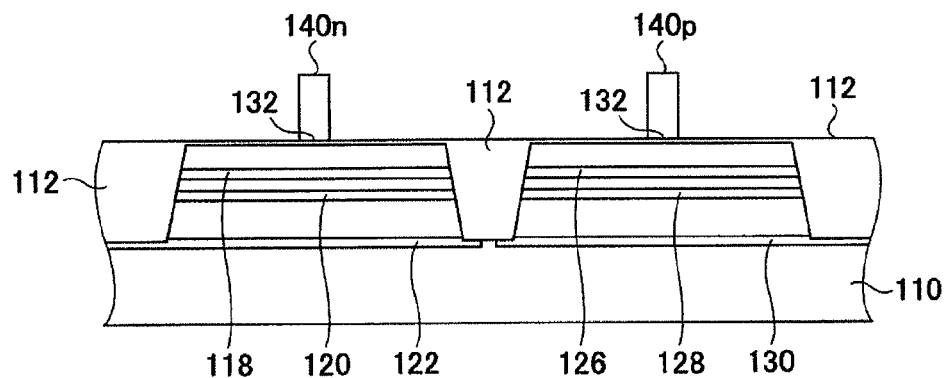
FIG. 17E illustrates a procedure for manufacturing a semiconductor device according the sixth embodiment of the present invention (part 5).

By removing the resist pattern 138 and the antireflection film 136, a CMOS device shown in FIG. 17E is formed.

In the embodiments of the present invention, a posi-type photomask is taken as an example; however, the present invention is similarly effective for a nega-type photomask.

The present invention is not limited to the specifically disclosed embodiment, and variations and modifications may be made without departing from the scope of the present invention.

What is claimed is:

1. A photomask comprising:
   a transparent substrate;
   an opaque film formed on the transparent substrate, wherein the opaque film is configured to form a device pattern with which a wafer is exposed; and
   at least one pair of assist patterns formed by the opaque film, the at least one pair of assist patterns being adjacent to and separated from the device pattern on the transparent substrate, wherein a size of each assist pattern of the at least one pair of assist patterns is such that the assist pattern is not resolved on the wafer, wherein:
   the device pattern extends in a first direction,
   each assist pattern of the at least one pair of assist patterns extends in the first direction, and
   each assist pattern of the at least one pair of assist patterns includes narrow portions and wide portions that are alternately provided.

2. The photomask according to claim 1, wherein:
steps between the narrow portions and the wide portions are formed on at least one edge of each assist pattern of the at least one pair of assist patterns.

3. The photomask according to claim 1, wherein:
the narrow portions and the wide portions have differences in their widths, which fall in a range of 16 nm through 40 nm, and the narrow portions and the wide portions are repeatedly provided at intervals of 400 nm.

4. The photomask according to claim 1, wherein:
steps between the narrow portions and the wide portions are formed only on one edge of each assist pattern of the at least one pair of assist patterns, which edge is on a far side with respect to the device pattern.

5. The photomask according to claim 1, wherein:
steps between the narrow portions and the wide portions are formed on each of both edges of each assist pattern of the at least one pair of assist patterns.

6. The photomask according to claim 1, wherein:
on the outside of the at least one pair of assist patterns, another pair of assist patterns is formed, wherein each assist pattern of the other pair of assist patterns comprises, on each of both edges thereof, steps between narrow portions and wide portions corresponding to the narrow portions and the wide portions of each assist pattern of the at least one pair of assist patterns.

7. The photomask according to claim 1, wherein:
on the outside of the at least one pair of assist patterns, another pair of assist patterns is formed, wherein each assist pattern of the other pair of assist patterns does not comprise any steps.

8. The photomask according to claim 1, wherein:
the photomask comprises a halftone phase shift mask.

9. A method of manufacturing an electronic device, the method comprising the step of:
exposing a substrate in such a manner that a device pattern is formed on the substrate, wherein:
the step of forming the device pattern by exposing the substrate is performed with the use of a photomask, the photomask comprising:
a transparent substrate;
an opaque film formed on the transparent substrate, wherein the opaque film is configured to form the device pattern with which a wafer is exposed; and
at least one pair of assist patterns formed by the opaque film, the at least one pair of assist patterns being adjacent to and separated from the device pattern on the transparent substrate, wherein a size of each assist pattern of the at least one pair of assist patterns is such that the assist pattern is not resolved on the wafer, wherein:
the device pattern extends in a first direction,
each assist pattern of the at least one pair of assist patterns extends in the first direction, and
each assist pattern of the at least one pair of assist patterns includes narrow portions and wide portions that are alternately provided.

10. A method of manufacturing a photomask, wherein the photomask comprises:
a transparent substrate;
an opaque film formed on the transparent substrate, wherein the opaque film is configured to form a device pattern with which a wafer is exposed; and
at least one pair of assist patterns formed by the opaque film, the at least one pair of assist patterns being adjacent to and separated from the device pattern on the transparent substrate, wherein a size of each assist pattern of the at least one pair of assist patterns is such that the assist pattern is not resolved on the wafer, wherein:
the device pattern extends in a first direction,
each assist pattern of the at least one pair of assist patterns extends in the first direction, and
each assist pattern of the at least one pair of assist patterns includes narrow portions and wide portions that are alternately provided, the method comprising:
a measurement step of measuring an inter-pattern distance of the device patterns from pattern data;
a determination step of determining, according to the inter-pattern distance, a number of said at least one pair of assist patterns, a shape of each assist pattern, and a location for arranging each assist pattern on the photomask, by referring to a table, wherein the table comprises a relationship between the inter-pattern distance, a number of assist patterns comprising no step portions, and a location for arranging each assist pattern comprising no step portions, and a relationship between the inter-pattern distance, a number of assist patterns comprising the step portions, and a location for arranging each assist pattern comprising the step portions; and
a creation step of creating a mask pattern according to the contents determined in the determination step.

* * * * *